July 22, 1969 M. J. HELLSTROM 3,457,519

HIGH INPUT IMPEDANCE AMPLIFIER

Filed July 12, 1967

WITNESSES

Bernard R. Gieguez

James F. Young

INVENTOR

Melbourne J. Hellstrom

BY Dean Schron

ATTORNEY

United States Patent Office 3,457,519
Patented July 22, 1969

3,457,519

HIGH INPUT IMPEDANCE AMPLIFIER

Melbourne J. Hellstrom, Severna Park, Md., assignor to Westinghouse Electric Corporation, Pittsburgh, Pa., a corporation of Pennsylvania Filed July 12, 1967, Ser. No. 652,867
Int. Cl. H03f *1/32, 3/68, 3/30*
U.S. Cl. 330—24 8 Claims

ABSTRACT OF THE DISCLOSURE

A transistor amplifier stage develops a signal at the emitter electrode thereof. A non-linear resistance in the form of a diode has one electrode connected to the emitter electrode of the transistor stage and its other electrode connected through a resistance to a source of operating potential. A bias resistor is connected between the input of the amplifier stage and the second electrode of the diode and the operating point considerations are such that a small DC voltage drop exists across the bias resistor thereby providing a certain base bias current. With the application of low level AC signals, there exists at one end of the bias resistor the input signal and at the other end of the bias resistor a feedback signal which substantially reduces the AC voltage drop across the bias resistor to prevent an unwanted loading effect.

BACKGROUND OF THE INVENTION

Field of the invention

The invention relates to amplifier circuits and particularly to an amplifier circuit which provides a relatively high input impedance and is well adapted to be fabricated by integrated circuit techniques.

Description of the prior art

High input impedance circuits are utilized not only in impedance matching applications but are desirable for proper coupling of low frequency AC signals. In order to accomplish proper amplification of small signals, transistor amplifiers are designed to operate with fixed DC currents and voltages to establish what is generally termed bias conditions, and an operating point on the transistor characteristic curves.

A common type of biasing circuit for a transistor involves a voltage divider network connected between a source of operating potential and ground, with the base or input of the transistor stage being connected to a predetermined voltage point of the voltage divider. With the quiescent operating point thus established, the amplifier has a certain input impedance. When, however, an AC signal is coupled to the input, the resistances of the voltage divider network are in parallel with the input resistance of the transistor since from an AC consideration both the operating potential and ground are at an AC ground potential. The network for biasing the transistor therefor has the effect of loading down the circuit in that the input impedance is lowered for any applied input signal.

In order to eliminate the loading down effect various amplifier circuits utilize a feedback arrangement incorporating fairly large valued capacitor. A problem arises, however, when an amplifier is fabricated as an integrated circuit in that the values of capacitors that can be fabricated by integrated circuit techniques are extremely limited, typical maximum values being in the order of several hundred picofarads.

A general object of the present invention, therefore, is to provide an improved high input impedance amplifier.

Another object is to provide a high input impedance amplifier which obviates the need for large valued feedback capacitors and allows fabrication of the amplifier as an integrated circuit.

Summary of the invention

Briefly, there is provided an active semiconductor amplifier section including first and second terminals and an input terminal to which is applied input signals. A non-linear resistance means including first and second terminals has its first terminal connected through a first resistance means to a bias terminal, to which is applied operating potential, and its second terminal connected to the second terminal of the amplifier section. Means are connected to the amplifier section for developing a signal at the second terminal thereof such that a feedback signal appears at the first terminal of the non-linear resistance means. A bias resistance means is electrically connected between the input terminal of the amplifier section and the first terminal of the non-linear resistance means for establishing proper operating bias conditions.

Description of the preferred embodiment

Figure 1:
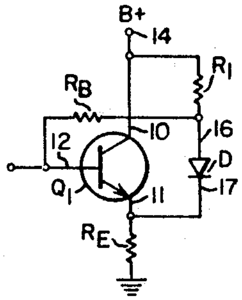
FIGURE 1 illustrates an embodiment of the present invention.

Referring now to FIG. 1, there is illustrated an amplifier including an active semiconductor amplifier section in the form of transistor $Q_1$ having a first terminal defined by the collector electrode 10, a second terminal defined by the emitter electrode 11 and an input terminal defined by the base electrode 12. The collector electrode 10 is electrically connected to the bias terminal 14 to which is applied a source of operating potential B+, and the emitter electrode 11 is electrically connected to ground potential through the emitter resistor $R_E$, the inclusion of which provides an output or feedback signal at the emitter electrode 11.

The amplifier also includes a non-linear resistance means illustrated by way of example as a diode D, having first and second terminals 16 and 17 with the first terminal 16 being connected to bias terminal 14 through resistor $R_1$, and second terminal 17 being connected to the emitter electrode 11.

A bias resistor $R_B$ provides proper operating current to the base of transistor $Q_1$ and is electrically connected between the input terminal 12 and the first terminal 16 of the diode D. In order to best understand the operation of the circuit of FIG. 1, reference should now be additionally made to FIGS. 2A and 2B.

Figure 2A:
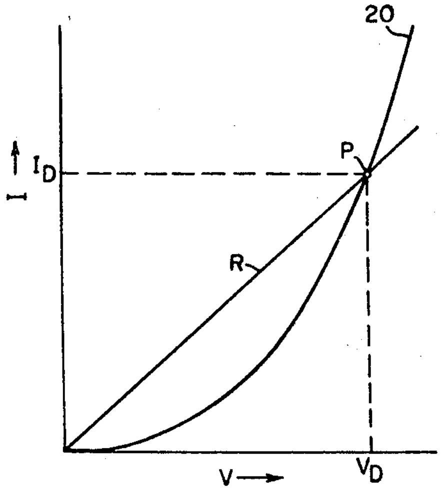
FIGURES 2A and 2B are current-voltage characteristic curves of a typical semiconductor junction diode illustrating respectively, DC and incremental resistances of a diode.

In FIG. 2A there is illustrated a typical voltage-current characteristic curve 20 of a diode. When the diode is connected in circuit, there exists, under equilibrium DC bias conditions, a current $I_D$ through the diode, with the voltage thereacross being $V_D$, and the operating point of the diode is established at point P. With operation at the defined point P, the diode may be analogized to a resistor having the value R, where $R=V_D/I_D$ and is graphically illustrated in FIG. 2A by the line R drawn from the origin through the operating point P.

Figure 2B:
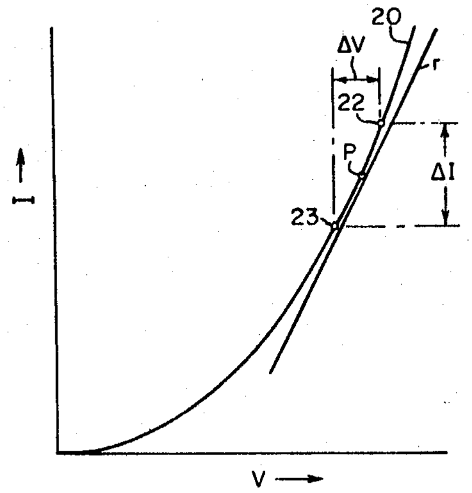

If small signal currents are applied to the diode the operating point P will move up and down the curve 20 to upper and lower limits 22 and 23 illustrated in FIG. 2B. The change in current between these limits is labelled $\Delta I$, whereas the change in voltage is represented by the quantity $\Delta V$. The increment $\Delta V$ divided by the increment $\Delta I$ yields an equivalent increment resistance $r$ which in actuality is the reciprocal of the slope of the curve 20 at point P, which slope is represented in FIG. 2B by the line $r$. In brief summary, therefore, from DC considerations it is seen from FIG. 2A that the diode for purposes of establishing the operating point P may be defined by a first resistance R whereas from an AC consideration as seen in FIG. 2B, the diode, at the operating point P, is characterized by a second and much lower incremental resistance $r$ as indicated by the greater slope of the line $r$. These features are utilized in the operation of the circuit of FIG. 1 to which reference is again made.

In the construction of the circuit of FIG. 1, either with discrete components or by integrated circuit fabrication, the diode D is chosen or made such that at equilibrium conditions it will experience a greater voltage drop than the base-emitter diode of transistor $Q_1$. Two current paths exist between the first and second terminals 16 and 17 of the diode; one path being through the diode D and the other path being through bias resistor $R_B$ and the base-emitter diode of $Q_1$. Since the voltage drop across the diode D is greater than the voltage drop across the base-emitter diode of transistor $Q_1$ and since the voltage drop across the paths (the diode D path and the $R_B$-base-emitter diode path) is the same, the difference in voltage drop appears across the bias resistor $R_B$ which, therefore, provides base bias current having a magnitude equal to the voltage across $R_B$ divided by the value of $R_B$.

If the diode D is fabricated from the same material or on the same integrated circuit chip as the transistor $Q_1$, the circuit of FIG. 1 is self-regulating with respect to changes in temperature or supply voltage. By way of example, any change in temperature will affect the semiconductor junctions of the diode and the base-emitter diode of transistor $Q_1$ by similar amounts. That is, if the voltage across diode D decreases or increases due to a temperature change, the voltage across the base-emitter diode of transmitter $Q_1$ will decrease or increase by substantially the same amount and the combined effect thereby tends to maintain the voltage across and hence the current through the bias resistance $R_B$ at a constant value.

Figure 1A:
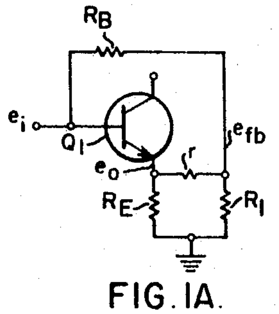
FIGURE 1A illustrates the AC circuit equivalent of FIGURE 1.

Upon the application of a low level input signal, the diode D presents an incremental resistance $r$ having a relatively low value, as illustrated in FIG. 2B. In order to best explain the dynamic operation of the circuit of FIG. 1, reference should now be made to FIG. 1A which illustrates an AC equivalent circuit of FIG. 1. From an AC signal standpoint the source of operating potential, B+, applied at bias terminal 14 is an AC ground. Therefore, resistance $R_1$ is illustrated as being connected to ground potential. The resistance $r$ connecting the other end of resistance $R_1$ to the emitter 11 of transistor $Q_1$ represents the incremental resistance $r$ of the diode as previously explained.

If the input signal is $e_i$ the signal at the emitter electrode 11 is $e_o$ and in the emitter follower configuration $e_o$ is somewhat less than $e_i$; a typical example being $e_o=.95e_i$. $e_{fb}$ is the voltage applied to one end of the bias resistor $R_B$ and its magnitude is dependent upon the magnitude of incremental resistance $r$. That is, the smaller the value of $r$ the closer $e_{fb}$ will be in value to $e_o$. With a small value of $r$, $e_{fb}$ will be somewhat less than $e_o$ and accordingly the bias resistor $R_B$ has on one end thereof the voltage $e_i$ and on the opposite end thereof the voltage $e_{fb}$. All of these voltages are in phase. With $e_{fb}$ being slightly less than $e_i$ the AC voltage differential across resistance $R_B$ will be very small and consequently very little signal current flows through $R_B$ and the circuit is not loaded down. By way of contrast if one of resistance $R_B$ is connected to $e_i$ and the other end of $R_B$ directly to a source of DC operating potential (an AC ground) 100% of the input AC signal would appear across the bias resistor and severe loading would occur.

Accordingly, it is seen that the non-linear resistance, in the form of diode D, exhibits, from a DC consideration, a resistance R of such value that DC voltage difference results across the bias resistor $R_B$ to provide proper base bias current, and from an AC consideration the diode D exhibits an incremental and much lower resistance $r$ which results in an extremely small AC voltage differential across the bias resistance $R_B$ to minimize loading effects.

Figure 3:
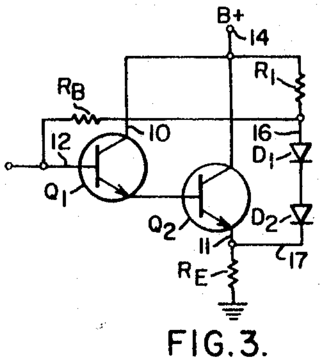
FIGURE 3 illustrates another embodiment of the invention utilizing a Darlington configuration.

In the modification of FIG. 3, the active semiconductor amplifier section includes transistors $Q_1$ and $Q_2$ in a Darlington configuration. Circuit points and components similar to those of FIG. 1 have been given like reference characters. Between the input terminal 12 and the second terminal 11 there exists two diode drops, that is, the base-emitter diode of transistor $Q_1$ and the base-emitter diode of transistor $Q_2$. Accordingly, with diodes utilized as the non-linear resistance means there is provided a pair of diodes $D_1$ and $D_2$ serially connected between first terminal 16 and second terminal 17 with the diodes $D_1$ and $D_2$ being fabricated such that the combined voltage drop across the series at the design value of operating current is somewhat greater than the voltage drop from input terminal 12 to the second terminal 11, that is, the combined base-emitter diode drops of transistors $Q_1$ and $Q_2$.

Figure 4:
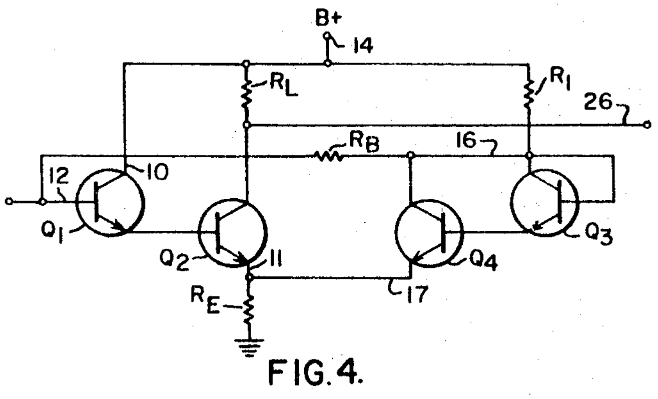
FIGURE 4 illustrates another embodiment of the invention.

In modification of FIG. 4, the amplifier section includes a first transistor $Q_1$ and a second transistor $Q_2$ which includes in the collector circuit thereof a load resistor $R_L$. In order to provide an amplified output signal to a subsequent stage, or other utilization means, there is provided output lead means 26 connected to the collector of $Q_2$.

The non-linear resistance means between terminals 16 and 17 include transistors $Q_3$ and $Q_4$, with the collector of $Q_3$ being connected to the base of $Q_3$ for utilization of the base-emitter diode characteristics. The combined voltage drops of the base-emitter diode of transistor $Q_3$ and the base-emitter diode of transistor $Q_4$ are somewhat greater than those of transistors $Q_1$ and $Q_2$, as previously explained. Obviously, other arrangements of transistors may be utilized to obtain the desired non-linear resistance means.

Although the present invention has been described with a certain degree of particularity, it should be understood that the present disclosure has been made by way of example and that modifications and variations of the present invention are made possible in the light of the above teachings.

I claim as my invention:

1. A high input impedance amplifier comprising:

(A) an active semiconductor amplifier section including,
  (1) a first terminal,
  (2) a second terminal, and
  (3) an input terminal for the application of input signals;
(B) a bias terminal for the application of a bias potential;
(C) non-linear resistance means including,
  (1) a first terminal, and
  (2) a second terminal;
(D) first resistance means electrically connected between said bias terminal and the first terminal of said non-linear resistance means;
(E) means for providing a feedback signal at the second terminal of said amplifier section;
(F) the second terminal of said non-linear resistance means being electrically connected to the second terminal of said amplifier section;
(G) the first terminal of said amplifier section being electrically connected to said bias terminal; and
(H) bias resistance means electrically connected between the first terminal of said non-linear resistance means and said input terminal.

2. An amplifier according to claim 1 wherein:
(A) the non-linear resistance means is a semiconductor diode.

3. An amplifier according to claim 1 wherein:
(A) the semiconductor amplifier section comprises a transistor.

4. An amplifier according to claim 1 wherein:
(A) the non-linear resistance means is a diode and
(B) said diode, under DC bias conditions exhibits a greater voltage drop than the base-emitter diode of the transistor.

5. An amplifier according to claim 1 wherein:
(A) the amplifier section comprises two transistors connected in a Darlington pair configuration.

6. An amplifier according to claim 5 wherein:
(A) the non-linear resistance means comprises two serially connected diodes.

7. A high input impedance amplifier comprising:
(A) an amplifier section including an input;
(B) means for providing a signal $e_0$ at a circuit point in response to an input signal $e_1$, where $e_0<e_1$;

(C) bias resistance means;
(D) non-linear resistance means connected to said circuit point for providing a voltage at one end of said bias resistance means;
(E) the other end of said bias resistance means being electrically connected to said input.

8. An amplifier according to claim 1 wherein:
(A) the non-linear resistance menas includes transistor means.

References Cited

UNITED STATES PATENTS

| | | | |
|---|---|---|---|
| 3,050,644 | 8/1962 | Ironside | 330—24 X |
| 3,302,124 | 1/1967 | Dix | 330—23 |

FOREIGN PATENTS

| | | |
|---|---|---|
| 1,352,233 | 1/1963 | France. |

ROY LAKE, Primary Examiner

L. J. DAHL, Assistant Examiner

U.S. Cl. X.R.

330—23, 25